(12) United States Patent
Mansouri et al.

(10) Patent No.: US 10,620,244 B2
(45) Date of Patent: Apr. 14, 2020

(54) REMOTE LEAK AND FAILURE DETECTION OF ELECTRICAL WATER HEATERS THROUGH TEMPERATURE AND POWER MONITORING

(71) Applicant: Battelle Memorial Institute, Columbus, OH (US)

(72) Inventors: Seyed A. Mansouri, Columbus, OH (US); Eric Rehberg, Westerville, OH (US)

(73) Assignee: Battelle Memorial Institute, Columbus, OH (US)

( * ) Notice: Subject to any disclaimer, the term of this patent is extended or adjusted under 35 U.S.C. 154(b) by 0 days.

(21) Appl. No.: 16/177,882

(22) Filed: Nov. 1, 2018

(65) Prior Publication Data

US 2019/0072591 A1 Mar. 7, 2019

Related U.S. Application Data

(62) Division of application No. 14/976,540, filed on Dec. 21, 2015, now Pat. No. 10,145,869.

(Continued)

(51) Int. Cl.
*G01R 21/133* (2006.01)
*G05B 15/02* (2006.01)
(Continued)

(52) U.S. Cl.
CPC .......... *G01R 21/133* (2013.01); *G01K 1/024* (2013.01); *G01K 1/026* (2013.01); *G01K 13/02* (2013.01); *G05B 15/02* (2013.01); *G05F 1/66* (2013.01)

(58) Field of Classification Search
None
See application file for complete search history.

(56) References Cited

U.S. PATENT DOCUMENTS 6,265,699 B1 7/2001 Scott
6,526,807 B1 * 3/2003 Doumit .................. G01M 3/04
340/605

(Continued)

OTHER PUBLICATIONS

Fanney et al.; The Thermal Performance of Residential Electric Water Heaters Subjected to Various Off-Peak Schedules; Journal of Solar Energy Engineering; vol. 118; pp. 73-80; 1996.

(Continued)

*Primary Examiner* — Jennifer L Norton
(74) *Attorney, Agent, or Firm* — Fay Sharpe LLP

(57) ABSTRACT

An aggregator is in operative communication with an aggregation of electric water heaters to receive thermostat readings and power consumption readings from the electric water heaters and to communicate demand response dispatch signals to the electric water heaters. The aggregator performs operations including: responding to instructions for a desired demand response by generating the demand response dispatch signals for the electric water heaters so as to cause the aggregation to draw electrical power providing the desired demand response; and determining whether an electric water heater of the aggregation has a failure and generating a notification of the failure. The determining including at least one of: determining whether the electric water heater has a failed heating element based on the thermostat readings received from the electric water heater; and determining whether the electric water heater has a water leak based on the power consumption readings received from the electric water heater.

13 Claims, 2 Drawing Sheets

Related U.S. Application Data

(60) Provisional application No. 62/095,631, filed on Dec. 22, 2014.

(51) Int. Cl.
    *G05F 1/66*     (2006.01)
    *G01K 13/02*     (2006.01)
    *G01K 1/02*     (2006.01)

(56) References Cited

U.S. PATENT DOCUMENTS

| | | |
|---|---|---|
| 6,955,301 B2 | 10/2005 | Munsterhuis |
| 9,105,175 B1 * | 8/2015 | Cantolino ............... F24H 9/16 |
| 9,151,516 B2 | 10/2015 | Buescher |
| 9,195,242 B2 | 11/2015 | Zobrist |
| 9,823,156 B1 * | 11/2017 | Jerphagnon ............ A01G 25/16 |
| 9,998,475 B2 * | 6/2018 | Ruffner ............. G06Q 30/0202 |
| 2004/0176858 A1 | 9/2004 | Kuwahara |
| 2005/0147402 A1 | 7/2005 | Baxter |
| 2006/0013573 A1 | 1/2006 | Phillips |
| 2006/0059977 A1 * | 3/2006 | Kates ................. G01M 3/2807 73/40 |
| 2006/0123807 A1 * | 6/2006 | Sullivan ............... G01D 4/004 62/129 |
| 2009/0105888 A1 | 4/2009 | Flohr |
| 2010/0004790 A1 | 1/2010 | Harbin, III |
| 2011/0195646 A1 | 8/2011 | Muller |
| 2012/0150359 A1 | 6/2012 | Westergaard |
| 2013/0146586 A1 | 6/2013 | Harbin, III |
| 2014/0037275 A1 | 2/2014 | Flohr |
| 2014/0214227 A1 | 7/2014 | Thornton |
| 2014/0228993 A1 | 8/2014 | Minnoy |
| 2014/0241708 A1 | 8/2014 | Chaudhry |
| 2015/0226460 A1 * | 8/2015 | Zemach ............ F24D 17/0021 700/90 |
| 2015/0256401 A1 * | 9/2015 | Zinger ................. H04L 41/14 370/401 |
| 2019/0390989 A1 * | 12/2019 | Raduchel ................ H04Q 9/00 |
| 2020/0004231 A1 * | 1/2020 | Anderson ............ F24H 9/2007 |

OTHER PUBLICATIONS

Vrettos et al.; Load Frequency Control by Aggregations of Thermally Stratified Electric Water Heaters; Innovative Smart Grid Technologies (ISGT Europe); 2012.

Koch, S.; Demand Response Methods for Ancillary Services and Renewabel Energy Integration in Electric Power Systems; Dipl.-Inc., University of Stuttgart; Diss. No. 20470; 2012.

* cited by examiner

REMOTE LEAK AND FAILURE DETECTION OF ELECTRICAL WATER HEATERS THROUGH TEMPERATURE AND POWER MONITORING

This application is a divisional of U.S. patent application Ser. No. 14/976,540, filed Dec. 21, 2015 and titled "REMOTE LEAK AND FAILURE DETECTION OF ELECTRICAL WATER HEATERS THROUGH TEMPERATURE AND POWER MONITORING", which claims the benefit of U.S. Provisional Application No. 62/095,631 filed Dec. 22, 2014 and titled "REMOTE LEAK AND FAILURE DETECTION OF ELECTRICAL WATER HEATERS THROUGH TEMPERATURE AND POWER MONITORING", the disclosures of which are incorporated herein by reference in their entirety.

BACKGROUND

The following relates to the electrical device maintenance arts, electrical demand response arts, and related arts.

In conventional electrical power grid management, electrical power generation is controlled to match the current power demand. This approach requires making adequate provision for peak load by providing a source of excess power generating capacity, for example by providing ancillary generators that are brought on-line at peak demand hours. The excess power generating capacity is not used except during peak demand periods, and usually represents a net cost for the utility provider. Other approaches for matching generation to demand include shifting power between geographical grid regions, which again usually represents a net cost to the utility due to transmission line losses and so forth.

In demand response systems, loads (i.e. demand) are adjusted to match the available power generation. This approach can be cost effective since the utility can provide less excess power generating capacity. By way of illustrative example, Kirby, "Spinning Reserve From Responsive Loads", Oak Ridge National Laboratory ONRL/TM-2003/19 (Mar. 2003) discloses loads that are aggregated to operate as a contingency reserve, e.g. spinning reserve. The loads may be air conditioners, water heaters, or so forth. A wireless communication network including the Internet is employed to send curtailment commands to thermostats which respond by taking immediate action or adjusting their schedules for future action. The thermostats collect data on temperature, set point, and power consumption on a minute-by-minute basis, and these data are reported to the utility.

The Federal Energy Regulatory Commission (FERC) has codified incentivizing demand response systems in Order No. 745 issued Mar. 2011, which mandates compensation for providers of demand response participating in the wholesale power marketplace. FERC Order No. 745 directs that "when a demand response resource participating in an organized wholesale energy market administered by an RTO or ISO has the capability to balance supply and demand as an alternative to a generation resource and when dispatch of that demand response resource is cost-effective as determined by the net benefits test described herein, that demand response resource must be compensated for the service it provides to the energy market at the market price for energy, referred to as the locational marginal price (LMP)." FERC Order No. 755 provides similar provisions pertaining to ancillary services.

The mandated benefit is directed to the aggregator, which in turn must recruit and retain loads owned by third parties (e.g., residences or small businesses) to participate in the aggregation of loads. These third parties typically must also be compensated, which reduces the net profit earned by the aggregator.

BRIEF SUMMARY

In some illustrative embodiments disclosed as illustrative examples herein, a demand response system comprises an aggregation of electric water heaters, each electric water heater including an electronic controller, and an aggregator in operative communication with the electric water heaters via the electronic controllers to receive thermostat readings and power consumption readings from the electric water heaters and to communicate demand response dispatch signals to the electric water heaters. The aggregator comprises an electronic data processing device configured to perform operations including: responding to instructions for a desired demand response by generating the demand response dispatch signals for the electric water heaters so as to cause the aggregation to draw electrical power providing the desired demand response; and determining whether an electric water heater of the aggregation has a failure and generating a notification of the failure. The determining including at least one of: determining whether the electric water heater has a failed heating element based on the thermostat readings received from the electric water heater; and determining whether the electric water heater has a water leak based on the power consumption readings received from the electric water heater.

In some illustrative embodiments disclosed as illustrative examples herein, a demand response system comprises: an aggregation of loads that draw electricity wherein each electric water heater includes an electronic controller, and an aggregator in operative communication with the loads via the electronic controllers to receive load state information from the loads and to communicate demand response dispatch signals to the loads. The aggregator comprises an electronic data processing device configured to perform operations including: responding to instructions for a desired demand response by generating the demand response dispatch signals for the loads so as to cause the aggregation to draw electrical power providing the desired demand response; and determining a load of the aggregation has a failure based on the load state information received by the aggregator from the loads and generating a notification of the failure.

In some illustrative embodiments disclosed as illustrative examples herein, a demand response method operates on an aggregation of electric water heaters wherein each electric water heater includes an electronic controller. The demand response method comprises: at an aggregator comprising an electronic data processing device, receiving thermostat and power consumption readings from the electric water heaters via the electronic controllers of the electric water heaters; at the aggregator, receiving instructions for a desired demand response; using the aggregator comprising the electronic data processing device, generating demand response dispatch signals for the electric water heaters so as to cause the aggregation to draw electrical power providing the desired demand response; communicating the demand response dispatch signals to the electric water heaters and operating the electric water heaters in accordance with the demand response dispatch signals; and using the aggregator comprising the electronic data processing device, determining an electric water heater of the aggregation has a failure and generating a notification of the failure. The determining including at least one of: determining the electric water heater has a failed heating element based on the thermostat readings received at the aggregator from the electric water heater, and determining the electric water heater has a water leak based on the power consumption readings received at the aggregator from the electric water heater.

DETAILED DESCRIPTION

Figure 1:
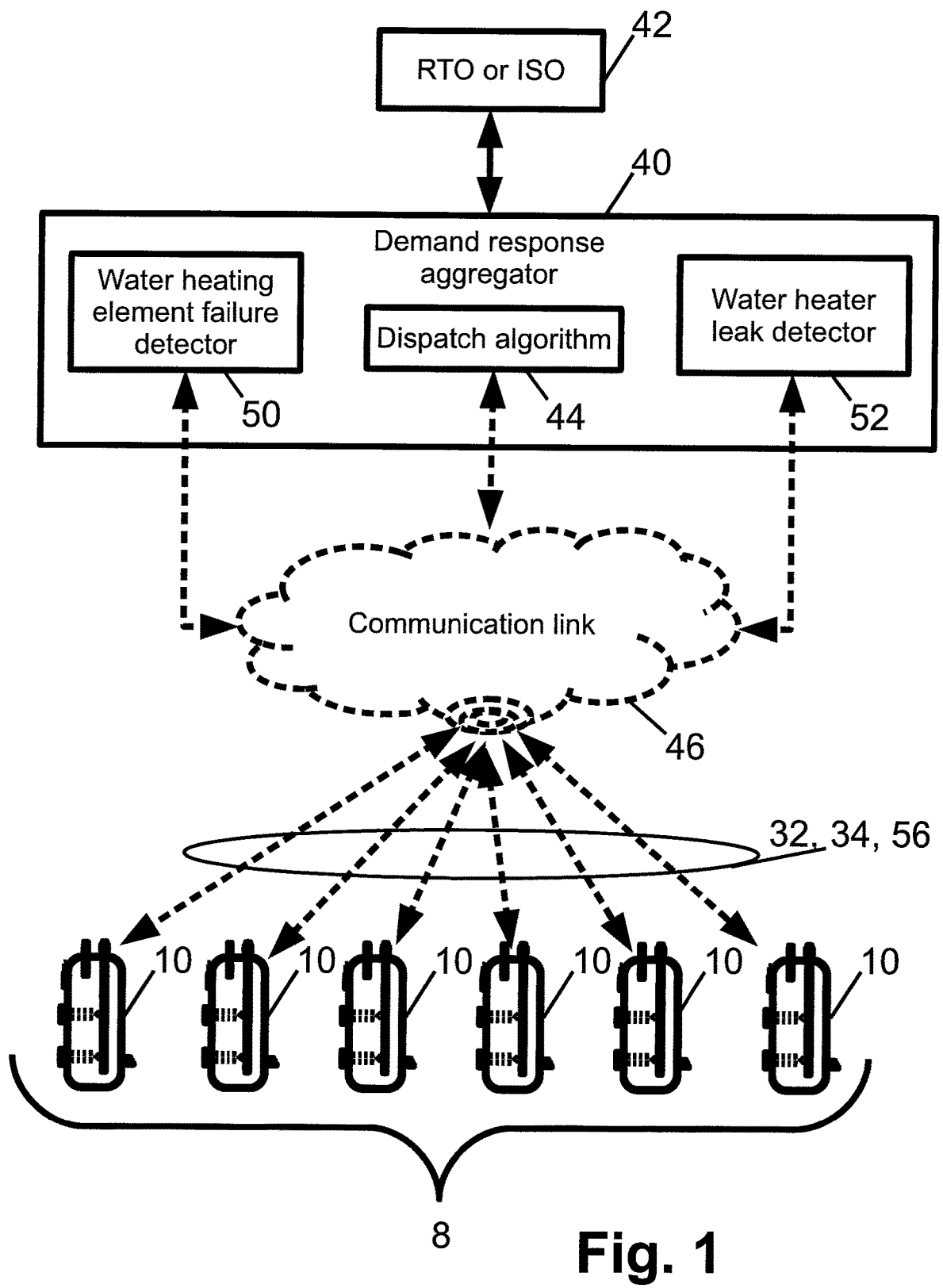
FIG. 1 diagrammatically shows a demand response system employing an aggregation of water heater loads, which also includes remote heater element failure detection and water heater leak detection capability.
Figure 2:
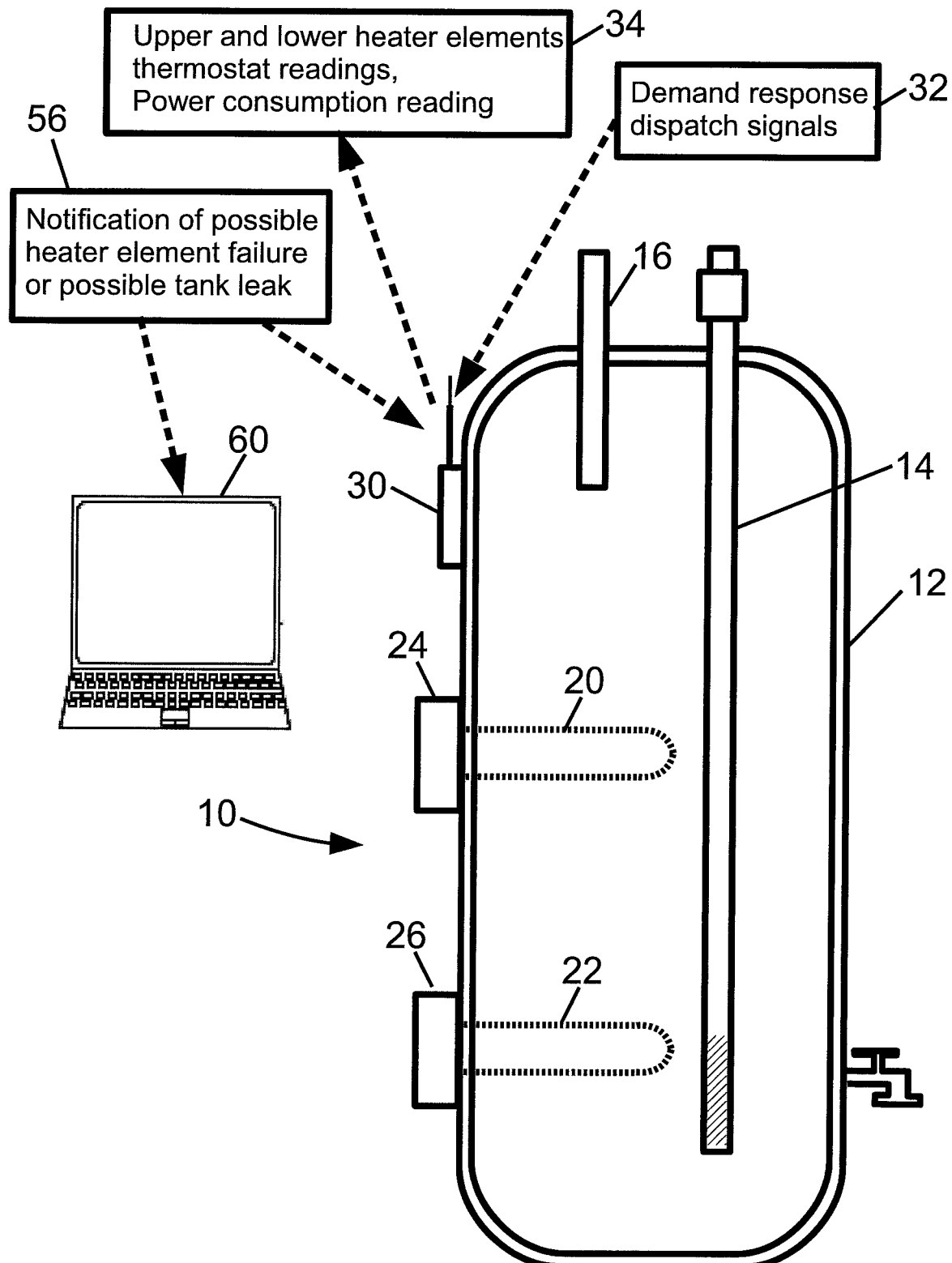
FIG. 2 diagrammatically shows a sectional view of an illustrative electric water heater of the demand response system of FIG. 1, along with a diagrammatic indication of communications.

With reference to FIGS. 1 and 2, a demand response system includes an aggregation 8 of electric water heaters 10. While the illustrative loads of the aggregation 8 are electric water heaters 10, more generally the loads may be other types of electric power consuming loads, such as air conditioners, heating-ventilation-air-conditioning (HVAC) units, dishwashers, or so forth. FIG. 2 diagrammatically shows a simplified sectional view of one electric water heater 10, which includes a water storage tank 12, a cold water feed pipe 14 which delivers cold water near the bottom of the tank 12, and a hot water outlet pipe 16 which allows for hot water to be extracted from near the top of the tank 12. The electric water heater 10 further includes an upper resistive heating element 20 and a lower resistive heating element 22. Typically, one of these heating elements 20, 22 may be active at any given time to heat up the water. The heating elements 20, 22 have respective thermostats 24, 26 that control the respective heating elements 20, 22. In a typical configuration, the upper thermostat 24 is the main controller and will keep the upper heating element 20 on until the top portion (e.g., top two-thirds) of the tank 12 reaches the set point temperature; once that temperature is reached the upper thermostat 24 turns off the upper element 20 and lets the lower thermostat 26 take control of the lower element 22 to maintain the temperature.

Each electric water heater 10 is fitted with a wired or wireless (as illustrated) electronic controller 30 configured to interact with the demand response system. The detailed design of the electronic controller 30 can vary—for example, it may adjust the temperature set point of the thermostats 24, 26 while the thermostats 24, 26 continue to control the respective heating elements 20, 22. In another design, the electronic controller 30 positively controls the thermostats 24, 26 by instructing the thermostats 24, 26 to turn the respective heating elements 20, 22 on or off. The electronic controller 30 also acquires operational data from the thermostats 24, 26 including temperature readings for the upper and lower elements and combined power drawn by the electric heating elements 20, 22. These readings are acquired relatively frequently, for example on a per-minute basis. The electronic controller 30 further includes wired or wireless (as illustrated) connectivity enabling the electronic controller 30 to receive demand response dispatch signals 32 from the demand response system, and to communicate water heater state messages 34 including the acquired temperature and power consumption readings to the demand response system. The electronic controller 30 operates to control the temperature of water in the water storage tank 12. This can be done in various ways. In one approach, the controller 30 operates a power relay (not shown) on the electrical power line supplying electrical power to the heating elements 20, 22, and the thermostats 24, 26 are set to an "always on" position (e.g. by setting the set point of the thermostats 24, 26 to a high value) so that the controller 30 directly operates the heating elements 20, 22 via the power relay. In another approach, the controller 30 positively operates the thermostats 24, 26, or alternatively adjusts the temperature set point of the thermostats 24, 26, to control the water temperature. The electronic controller 30 also operates, or controls operation of, the water heater 10 in order to implement the received demand response dispatch signals 32. For example, if the demand response dispatch signal is a curtailment command then the electronic controller 30 suitably lowers the temperature set point or reduces the on time of the thermostats 24, 26 (if controlled by the controller 30, or alternatively the set point or on time employed by the control algorithm implemented by the controller 30 may be adjusted if the controller 30 directly controls the heating elements 20, 22 via a power relay or the like) in order to reduce the power consumed by the electric water heater 10. The amount of on-board intelligence or data processing capability built into the electronic controller 30 is design-specific. For example, in some embodiments the demand response dispatch signals 32 received at the electronic controller 30 are simple "on" or "off" commands that are applied by the electronic controller 30, thus requiring minimal intelligence or data processing capability at the controller 30. In other embodiments, the demand response dispatch signals 32 are of a nature requiring more processing at the electronic controller 30—for example, the demand response dispatch signals 32 may be in the form of a dispatch level, and the electronic controller 30 is programmed to process the acquired thermostat temperature readings to determine an "urgency" state of the electric water heater 10 and to compare this urgency state with the dispatch level and decide whether the water heater 10 should be turned on or off based on this comparison—such a design calls for a greater level of on-board intelligence or data processing capability for the controller 30.

With particular reference now to FIG. 1, the demand response system includes the aggregation 8 of electric water heaters 10 as just described, in combination with a demand response aggregator component 40 which suitably comprises a compute, network server, or other electronic data processing device programmed to perform the disclosed functions of the aggregator 40. The demand response aggregator component 40 is in operative communication with an illustrative regional transmission organization (RTO) or independent system operator (ISO) 42 or other grid operator (or sub-operator) so as to participate in an organized wholesale energy market administered by the grid operator 42. The grid operator 42 leverages the load capacity under control of the aggregator 40 to provide one or more ancillary grid services relating to the balancing of supply and demand, such as providing excess load capacity for use in load shifting, peak shaving, frequency regulation, or so forth. To this end, the grid operator 42 communicates with the aggregator 40 to convey instructions or signals that cause the aggregator 40 to issue demand response dispatch signals 32 to the loads 10 that cause the loads to, in the aggregate, draw electrical power so as to provide the desired aggregate power draw. The type of these communications between the grid operator 42 and the aggregator 40 depend on the type of ancillary service(s) being provided and the grid design (available communication hardware and so forth). For an ancillary service having a relatively long time frame of tens of minutes, hours, or longer, these communications may take the form of telephone calls, with a human operator interpreting and manually entering telephonically received instructions into a computer embodying the aggregator 40. For an ancillary service having a shorter time frame of minutes to hours, electronic communications may be employed, such as the ISO or RTO 42 entering a curtailment command into a computer in electronic communication (e.g., via the Internet) with a computer embodying the aggregator 40. In the case of the ancillary service known as frequency regulation, the grid operator 42 typically generates an automatic generation control (AGC) signal that is updated frequently, e.g. every 4 seconds in some embodiments, and is communicated to all providers of frequency regulation excess capacity including ancillary generators and the aggregator 40.

The aggregator 40 receives the communications from the grid operator 42 and applies a dispatch algorithm 44 that determines the dispatch signals 32 to send to the loads 10 of the aggregation 8 in order to achieve the desired demand response (e.g., increase or decrease the total electrical power draw of the aggregation 8). In determining the dispatch signals 32, the dispatch algorithm 44 run by the aggregator 40 may also need to satisfy constraints on the power draw of individual loads 10. These constraints may, for example, be determined based on the load state information 34 received from the respective loads 10, such as the upper and lower heater element thermostat readings and the present load power consumption. By way of illustrative example, if the thermostat readings indicate the water in the water tank 12 of a water heater 10 is at its maximum allowable temperature, then a constraint may be that water heater cannot run in the next time interval. Conversely, if the thermostat readings indicate the water is at its minimum allowable temperature, then a constraint may be that water heater must run in the next time interval. In addition to hard constraints (e.g. "must run" or "must not run"), the individual load constraints may be soft constraints. For example, if the thermostat readings indicate that the water in a tank is close to the minimum allowable temperature, but not at that minimum, then the dispatch algorithm 44 is suitably biased toward running that water heater; conversely, for a water heater near the maximum allowable temperature the dispatch algorithm 44 suitably biases against running that water heater. Another possible soft constraint is to bias against rapid cycling of power consumption by any individual water heater. Based on the communicated demand response instructions from the grid operator 42 and any load constraints, the dispatch algorithm 44 performs a constrained optimization of the dispatch signals for the next time interval in order to optimally satisfy the demand response instructions while obeying any load constraints. In this constrained optimization, the availability of a (relatively large) aggregation 8 of loads 10, which are generally in different states at any given time, enables the demand response to be satisfied even if some loads are unable to contribute to the demand response at a given time, because there will be other loads in different states that can contribute to the demand response.

As diagrammatically shown in FIG. 1, a communication link 46, such as the Internet, a paging network, or so forth, provides the communication link via which the load state information 34 is conveyed from the loads 10 to the aggregator 40, and via which the demand response dispatch signals 32 are conveyed from the aggregator 40 to the loads 10. FIG. 1 illustrates a wireless network; however, it is to be understood that the communication link may include some wired components, for example all loads in a particular building may be hardwired to an Internet hub that then wirelessly communicates with the Internet. The communication link 46 may also be heterogeneous, for example including wired and/or Bluetooth communication from loads to receiver units that are connected by wired and/or wireless Ethernet with an Internet hub. It is also contemplated to employ an entirely wired communication link.

The demand response system described with reference to FIGS. 1 and 2 enables an aggregator entity (person, business, or so forth) that deploys the demand response aggregator 40 to participate in the wholesale power marketplace. For example, the aggregator 40 may estimate the maximum excess load capacity it can provide for demand response and generate a bid to the grid operator 42 to provide that excess load capacity to provide demand response in support of a grid ancillary service. If FERC Order No. 755 is in effect, then the aggregator entity is suitably reimbursed for this service at the market price for energy. However, this does not (directly) provide compensation for the load-owning entities, that is, the persons, businesses, or so forth that own the various loads 10 that make up the aggregation 8 whose excess load capacity is marketed by the aggregator entity. To compensate the load-owning entities one approach is some sort of profit-sharing arrangement in which the load owners share in the profits accrued by the aggregator entity. This approach has a disadvantage in that it reduces the net profit of the aggregator entity.

In an approach disclosed herein, another mode for compensating or incentivizing the load-owning entities is to leverage the demand response system to provide the secondary service of detecting equipment failure. In the case of water heaters, two common failure modes are: damage to one of the heating elements 20, 22; and a leak in the water tank 12 (including leaks at vessel penetrations into or out of the water tank 12, or leaks in piping connecting with those vessel penetrations). This compensation or incentive may be the sole motivator for load-owning entities to permit their loads to participate in the aggregation 8, or alternatively may be one compensation or incentive mode that is combined with one or more other incentive modes, such as a profit-sharing arrangement.

A water heating element failure detector 50 is integrated with the computer or other electronic data processing device embodying the demand response aggregator 40 and receives at least the thermostat readings of the load state information 34 reported by the electronic controller 30 of each water heater 10. In the following, the upper thermostat temperature reading is denoted $T_U$, the lower thermostat temperature reading is denoted $T_L$, and an average temperature is denoted $T_{avg} = \frac{1}{2}(T_U + T_L)$. Comparing the lower temperature $T_L$, the upper temperature $T_U$, and the average temperature $T_{avg}$ of the tank enables detection of failure of either the upper heater element 20 or the lower heater element 22.

In the case where the lower heating element 22 is damaged, a large temperature difference will be present between lower and upper temperatures readings since the cold water enters the tank from bottom via the cold water feed pipe 14 and hot water is drawn from top via the outlet pipe 16. Thus, failure of the lower heating element 22 may be detected by a test such as $T_U - T_L > T_{th,L}$ where $T_{th,L}$ is a threshold suitably determined empirically, for example by operating a test water heater with its lower heating element disabled. In an alternative embodiment the test is $$\frac{T_U - T_L}{T_{avg}} > \Delta_{th,L}$$

where $\Delta_{th,L}$ is again a threshold. This latter test compensates for the average tank temperature, since the temperature difference $(T_U-T_L)$ may be larger at higher average tank temperature $T_{avg}$ even in the absence of a tank leak.

In case of a failure of the upper heating element 20, in response to drawing water a large and rapid temperature decrease in the tank will be observed, since the upper thermostat 24 will not allow the lower thermostat 26 take control, and as the upper heating element 20 has failed there will be no hot water after few water draws. This analysis assumes a conventional water heater design in which the upper thermostat 24 is the main controller and operates until the upper temperature reading reaches the set point temperature and thereafter the upper heating element 20 turns off and control is passed to the lower thermostat 26 to maintain temperature by operating the lower heating element 22. Typically, however, the state information 34 conveyed by the electronic controller 30 does not include water flow information, since this would entail adding a flow meter to the water heater. Accordingly, the loss of the upper heating element may be detected by various tests that rely on the measured state data. In one approach, a difference function is defined as $F_{\Delta t}(t)=T_U(t-\Delta t)-T_U(t)$ where $\Delta t$ is a time interval which may be optimized empirically so that the temperature difference $F_{\Delta t}(t)$ detects the temperature drop during a water draw performed after failure of the upper heating element 20. The test is then $F_{\Delta t}(t)>T_{th,U}$ where $T_{th,U}$ is a threshold suitably again determined empirically, for example by operating a test water heater with its upper heating element disabled. This test will be satisfied the first time a water draw is performed after failure of the upper heating element causing the upper temperature to rapidly decrease leading to a rapid rise in the value of the difference function $F_{\Delta t}(t)$.

A water heater leak detector 52 is also integrated with the computer or other electronic data processing device embodying the demand response aggregator 40 and receives at least the power consumption readings of the load state information 34 reported by the electronic controller 30 of each water heater 10. In the following, the power consumption readings are denoted P(t) and constitute the power consumption as a function of time. In case of water leak, the water heating elements 20, 22 are required to operate more frequently and/or over longer intervals in order to heat water that flows in via the cold water pipe 14 to replace the leaked water in the tank and consequently draw more power. However, for a relatively slow leak this excess heating effect may be masked during periods of hot water usage by water flowing out of the tank through the outlet pipe 16 and consequent running of the heating elements 20, 22 to heat the replenishing cold water. Thus, the effect of a slow water leak on power consumption is likely to be most evident during periods of little or no hot water usage.

In one approach to implementing the leak detector 52, the average energy consumption $$E_T = \frac{1}{T} \int_T P(t)dt$$

over a time interval $T$ of, for example, one day or one week, is determined and compared with a baseline energy consumption $E_{T_0}$ over the same time interval. A suitable test for a water leak is then, for example, $E_T - E_{T_0} > T_{leak}$ indicates a leak, or $$\frac{E_T}{E_{T_0}} > T_{leak}$$

indicates a leak, where in both cases $T_{leak}$ is an empirically determined threshold for detecting a leak. The threshold $T_{leak}$ can also be chosen to balance sensitivity to small leaks (enhanced by reducing the value of $T_{leak}$) against the occurrence of false positives (detecting a leak when none is present, the possibility is reduced by increasing $T_{leak}$). The baseline energy consumption $E_{T_0}$ is suitably generated from historical data for the water heater, since hot water usage is expected to vary too much from water heater to water heater to enable defining a "universal" baseline. In some embodiments the time interval $T$ is chosen based on a priori knowledge so as to avoid time periods of expected hot water usage, such as morning and evening. For example, $T$ can be chosen to be the time interval of 1:00 am to 5:00 am when most people are expected to be sleeping. In another contemplated approach, $T$ is optimized respective the historical data in order to minimize the baseline energy consumption $E_{T_0}$ (subject to some minimum and maximum time interval constraints on $T$) so as to identify the time interval $T$ as a period of minimum energy draw and simultaneously determining that minimum energy draw $E_{T_0}$. Such an optimization can be repeated occasionally (e.g. once per month based on the last month's historical data) in order to ensure that $T$ and $E_{T_0}$ reflect recent usage of the water heater.

With continuing reference to FIGS. 1 and 2, the water heating element failure detector 50 and/or the water heater leak detector 52 outputs a notification 56 if a heating element failure or tank leak, respectively, is detected. As diagrammatically indicated in FIG. 2, the notification 56 may be communicated to the electronic controller 30, which then indicates the problem by a suitable human-perceptible alarm and/or display. For example, the electronic controller 30 can activate an audible alarm (e.g. beeper) and/or a visual alarm such as a flashing red light. If the electronic controller 30 includes a display (e.g. an LED screen or OLED screen) then the notification 56 can be shown on the display, possibly with additional information such as the identification of which water heater element 20, 22 has failed. Preferably the electronic controller 30 also includes an alarm reset feature, for example a button a user can press to cause transmission of a reset signal via the wireless link 46 to the relevant detector 50, 52 to cause it to reset the alarm.

Additionally or alternatively, the notification 56 may be sent to a computer 60 or other electronic device identified as associated with the load owner, as shown in FIG. 2. This advantageously informs the load owner of the notification 56 without relying upon the load owner actually inspecting the load controller 30, since such inspection in practice may occur only infrequently. In some aggregation-based demand response systems, the load owner can log into an Internet website maintained by the demand response system in order to monitor and optionally modify the load's participation in the aggregation 8—in such an arrangement, the notification 56 is suitably communicated to the load owner's account at this website and the load owner is given the notification at the next account log-in, or additionally or alternatively the notification 56 is pushed to the load owner's cellular telephone or other mobile device.

In the illustrative embodiment, the loads are water heaters and the detected load failure modes include a heating element failure and a tank leak. More generally, the loads can be other types of devices, such as air conditioners, HVAC units, dishwashers, or so forth, and the detected load failure modes are suitably specific to the load type. For example, in the case of an air conditioner the detected failure may be detection of a failure to cool the room, suitably detected by observing continued power consumption by the air conditioner without concomitant decrease in the room temperature of the air-conditioned space.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A demand response system comprising:
   an aggregation of electric water heaters, each electric water heater including an electronic controller; and
   an aggregator in operative communication with the electric water heaters via the electronic controllers to receive thermostat readings and power consumption readings from the electric water heaters and to communicate demand response dispatch signals to the electric water heaters, the aggregator comprising an electronic data processing device configured to perform operations including:
      responding to instructions for a desired demand response by generating the demand response dispatch signals for the electric water heaters and in response causes the aggregation to draw electrical power of the desired demand response, and
      determining whether an electric water heater of the aggregation has a failure and generating a notification of the failure, the determining including:
         calculating an average energy consumption of the electric water heater over a pre-defined time interval,
         determining a baseline energy consumption of the electric water heater over the pre-defined time interval,
         comparing the calculated average energy consumption to the determined baseline energy consumption, and
         determining the electric water heater has a water leak when a result of the comparison of the average energy consumption to the baseline energy consumption exceeds a threshold.

2. The demand response system of claim 1 wherein responding to the instructions for the desired demand response comprises:
   receiving an automatic generation control (AGC) signal of an electric power grid supplying electricity to the aggregation; and
   generating the demand response dispatch signals for the electric water heaters based on the AGC signal that causes the aggregation to draw electrical power providing frequency regulation.

3. The demand response system of claim 1 wherein responding to instructions for a desired demand response by generating the demand response dispatch signals for the electric water heaters that cause the aggregation to draw electrical power providing the desired demand response comprises:
   determining constraints on operation of the electric water heaters; and
   applying a dispatch algorithm to perform a constrained optimization of the demand response dispatch signals for a next time interval in order to optimally satisfy the desired demand response while obeying the constraints on operation of the electric water heaters.

4. The demand response system of claim 1 wherein the determined water leak corresponds to a leak at a vessel penetration into or out of a water tank of the electric water heater.

5. The demand response system of claim 4 wherein the determined water leak corresponds to a leak in a piping connecting with the vessel penetration into or out of the water tank of the electric water heater.

6. A demand response system comprising:
   an aggregation of loads that draw electricity wherein each bad includes an electronic controller; and
   an aggregator in operative communication with the loads via the electronic controllers to receive load state information from the loads and to communicate demand response dispatch signals to the loads, the aggregator comprising an electronic data processing device configured to perform operations including:
      responding to instructions for a desired demand response by generating the demand response dispatch signals for the loads that cause the aggregation to draw electrical power providing the desired demand response, and
      determining a load of the aggregation has a failure based on the load state information received by the aggregator from the loads and generating a notification of the failure, the determining including:
         calculating an average energy consumption of the load over a pre-defined time interval,
         determining a baseline energy consumption of the load over the pre-defined time interval,
         comparing the calculated average energy consumption to the determined baseline energy consumption, and
         determining the load has a water leak when a result of the comparison of the average energy consumption to the baseline energy consumption exceeds a threshold.

7. The demand response system of claim 6 wherein responding to the instructions for the desired demand response comprises:
   receiving an automatic generation control (AGC) signal of an electric power grid supplying electricity to the aggregation; and
   generating the demand response dispatch signals for the loads based on the AGC signal that causes the aggregation to draw electrical power providing frequency regulation.

8. A demand response method operating on an aggregation of electric water heaters wherein each electric water heater includes an electronic controller, the demand response method comprising:
   at an aggregator comprising an electronic data processing device, receiving thermostat and power consumption readings from the electric water heaters via the electronic controllers of the electric water heaters;

at the aggregator, receiving instructions for a desired demand response;

using the aggregator comprising the electronic data processing device, generating demand response dispatch signals for the electric water heaters that cause the aggregation to draw electrical power providing the desired demand response;

communicating the demand response dispatch signals to the electric water heaters and operating the electric water heaters in accordance with the demand response dispatch signals; and using the aggregator comprising the electronic data processing device, determining an electric water heater of the aggregation has a failure and generating a notification of the failure, the determining including:

calculating an average power consumption of the electric water heater over a pre-defined time interval, determining a baseline power consumption of the electric water heater over the pre-defined time interval, comparing the calculated average power consumption to the determined baseline power consumption, and determining the electric water heater has a water leak when a result of the comparison of the average power consumption to the baseline power consumption exceeds a threshold.

9. The demand response method of claim 8 wherein:

receiving the instructions for the desired demand response comprises receiving an automatic generation control (AGC) signal of an electric power grid supplying electricity to the aggregation; and generating the demand response dispatch signals for the electric water heaters comprises generating the demand response dispatch signals based on the AGC signal that causes the aggregation to draw electrical power providing frequency regulation.

10. The demand response method of claim 8 wherein generating demand response dispatch signals for the electric water heaters comprises:

determining constraints on operation of the electric water heaters; and applying a dispatch algorithm to perform a constrained optimization of the demand response dispatch signals for a next time interval in order to optimally satisfy the desired demand response while obeying the constraints on operation of the electric water heaters.

11. The demand response method of claim 8, wherein the pre-defined time interval is optimized via historical usage of the water heater to minimize the baseline power consumption.

12. The demand response system of claim 1, wherein the pre-defined time interval is optimized via historical usage of the water heater to minimize the baseline energy consumption.

13. The demand response system of claim 6, wherein the pre-defined time interval is optimized via historical usage of the water heater to minimize the baseline energy consumption.

* * * * *